(12) United States Patent
Bringivijayaraghavan et al.

(10) Patent No.: US 10,395,700 B1
(45) Date of Patent: Aug. 27, 2019

(54) INTEGRATED LEVEL TRANSLATOR

(71) Applicant: GLOBALFOUNDRIES INC., Grand Cayman (KY)

(72) Inventors: Venkatraghavan Bringivijayaraghavan, Cheyyar (IN); Sreenivasa Chaitanya Kumar Vavilla, Bangalore (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/926,272

(22) Filed: Mar. 20, 2018

(51) Int. Cl.
*G11C 11/00* (2006.01)
*G11C 7/12* (2006.01)
*G11C 11/412* (2006.01)
*G11C 11/419* (2006.01)

(52) U.S. Cl.
CPC .............. *G11C 7/12* (2013.01); *G11C 11/412* (2013.01); *G11C 11/419* (2013.01)

(58) Field of Classification Search
CPC . G11C 2207/002; G11C 7/065; G11C 7/1006; G11C 11/412
See application file for complete search history.

(56) References Cited

U.S. PATENT DOCUMENTS

| | | | |
|---|---|---|---|
| 6,208,575 B1* | 3/2001 | Proebsting | G11C 7/065 257/E21.659 |
| 6,958,948 B2* | 10/2005 | Shiraishi | G11C 11/419 365/189.05 |
| 6,992,915 B2* | 1/2006 | Kang | G11C 11/412 365/154 |
| 7,468,902 B2* | 12/2008 | Liaw | G11C 11/412 365/154 |
| 7,486,540 B2 | 2/2009 | Gouin et al. | |
| 7,738,306 B2* | 6/2010 | Shiah | G11C 7/065 365/189.09 |
| 8,023,351 B2* | 9/2011 | Hirabayashi | G11C 7/12 365/163 |
| 8,363,453 B2 | 1/2013 | Arsovski et al. | |
| 8,964,490 B2 | 2/2015 | Chow et al. | |
| 8,982,603 B2* | 3/2015 | Azuma | G11C 11/21 365/148 |
| 9,824,766 B2* | 11/2017 | Kato | G11C 16/28 |
| 2009/0235171 A1 | 9/2009 | Adams et al. | |
| 2015/0146479 A1 | 5/2015 | Pilo | |

* cited by examiner

*Primary Examiner* — Tuan T Nguyen
(74) *Attorney, Agent, or Firm* — Michael LeStrange; Hoffman Warnick LLC

(57) ABSTRACT

Embodiments of the present disclosure provide a circuit structure including: first PMOS and second PMOS each including a gate, source, and drain; wherein sources of first and second PMOS are coupled to first voltage source, gate of first PMOS is cross coupled to drain of second PMOS, gate of second PMOS is cross coupled to drain of first PMOS, drain of the first PMOS is coupled to first bit-line node, and wherein drain of second PMOS is coupled to second bit-line node; write bit-switch having first NMOS coupled to first bit-line node and second NMOS coupled to second bit-line node, wherein first and second NMOS of write bit-switch are respectively coupled to a pair of data nodes each receiving one of a pair of data inputs; and write driver, having a pair of transistor stacks each coupled to between one of the pair of data nodes and ground.

20 Claims, 4 Drawing Sheets

U S 10,395,700 B1

INTEGRATED LEVEL TRANSLATOR

TECHNICAL FIELD

Embodiments of the disclosure relate generally to a level translator, a circuit structure in static random access memory (SRAM) cells for level shifting of write data from one voltage source level to another, e.g., $V_{DD}$ (logic power supply) to $V_{CS}$ (SRAM power supply). Embodiments more particularly relate to a circuit structure that integrates a level translator with a write driver and bitswitch, without the use of conventional level shift circuitry and/or equivalent devices that consume additional space. The various embodiments described herein can be used in a variety of memory applications, such as high performance single port memories and time domain multiplex memory, or time-division multiplexing (TDM) memory.

BACKGROUND

Static random-access memory (SRAM) is a common type of semiconductor memory that uses flip-flop circuitry to store bits of binary data. Unlike dynamic random-access memory (DRAM), SRAM, though volatile, does not require periodic refreshing to ensure data is not distorted. SRAM is traditionally composed of arrays of SRAM bit cells. Each SRAM bit cell, typically composed of six or more transistors, stores a single bit of data that may be accessed by a pair of complementary bit lines. As memory technology has continued to advance, problems have arisen in maintaining SRAM bit cells as transistor memory technology produces smaller sizes with lower power structures. Specifically, the minimum voltage required for reliable operation of a SRAM cell is not scaling as fast as the operating supporting logic and write assist circuits. As a result, current SRAM cells are using dual power supplies, with one power supply, such as $V_{DD}$, used to power the SRAM peripheral circuitry and a second power supply operating at a higher voltage, $V_{CS}$, to power the memory array and bit cells. As a result of the two different voltages and power sources, the SRAM cell must be able to reconcile the two voltages. One solution to this issue is the use of voltage level shifting or level translation circuitry. A disadvantage associated with voltage level shifting and level translation circuitry is the need for additional space on a product to house these components, and additional power consumption to drive shifts between voltage levels.

SUMMARY

A first aspect of the present disclosure provides an integrated level translator circuit structure including: a first PMOS transistor and second PMOS transistor each including a gate, a source and a drain, wherein the sources of the first and second PMOS transistor are coupled to a first voltage source, the gate of the first PMOS transistor is cross coupled to the drain of the second PMOS transistor, the gate of the second PMOS transistor is cross coupled to the drain of the first PMOS transistor, the drain of the first PMOS transistor is coupled to a first bit-line node, and wherein the drain of the second PMOS transistor is coupled to a second bit-line node, a write bit-switch having a first NMOS transistor coupled to the first bit-line node and a second NMOS transistor coupled to the second bit-line node, wherein the first and second NMOS transistors of the write bit-switch are respectively coupled to a pair of data nodes each receiving one of a pair of data inputs, and a write driver, having a pair of transistor stacks each coupled to between one of the pair of data nodes and a ground.

A second aspect of the present disclosure provides an integrated level translator circuit structure including: a first PMOS transistor and a second PMOS transistor each including a gate, a source and a drain, wherein the sources of the first and second PMOS transistors are coupled to a first voltage source, the gate of the first PMOS transistor is cross coupled to the drain of the second PMOS transistor, the gate of the second PMOS transistor is cross coupled to the drain of the first PMOS transistor, the drain of the first PMOS transistor is coupled to a first bit-line node, and wherein the drain of the second PMOS transistor is coupled to a second bit-line node, a write bit-switch having a first NMOS transistor coupled to the first bit-line node and a second NMOS transistor coupled to the second bit-line node, wherein the first and second NMOS transistors of the write bit-switch are coupled to a first and second data node, respectively, and wherein the first and second data node are configured to receive a pair of data inputs, and a write driver having a third NMOS transistor and fourth NMOS transistor, each of the third and fourth NMOS transistors including a gate, a source and a drain, wherein the sources of the third and fourth NMOS transistors are coupled to a ground, wherein the drains of the third and fourth NMOS transistors are coupled to the first and second data nodes respectively.

A third aspect of the present disclosure provides an integrated level translator circuit structure including: a first PMOS transistor and a second PMOS transistor each including a gate, a source and a drain, wherein the sources of the first and second PMOS transistor source are coupled to a first voltage source, the gate of the first PMOS transistor is cross coupled to the drain of the second PMOS transistor, the gate of the second PMOS transistor is cross coupled to the drain of the first PMOS transistor, the drain of the first PMOS transistor is coupled to a first bit-line node, and wherein the drain of the second PMOS transistor is coupled to a second bit-line node, a write bit-switch having a first NMOS transistor coupled to the first bit-line node and a second NMOS transistor coupled to the second bit-line node, wherein the first and second NMOS transistors of the write bit-switch are coupled to a first and second data node, respectively, and wherein the first and second data node are configured to receive a pair of data inputs, and a write driver, further including: a first transistor stack, having a third NMOS transistor, a fifth NMOS transistor, a first supply PMOS transistor, each of the third and fifth NMOS transistors and first supply PMOS transistor including a gate, a source, and a drain, wherein the drain of the third NMOS transistor is coupled to the source of the fifth NMOS transistor, and the drain of the first supply PMOS transistor is coupled to the drain of the fifth NMOS transistor, wherein the drain of the third NMOS transistor is coupled to the first data node, and a second transistor stack, having a fourth NMOS transistor, a sixth NMOS transistor, a second supply PMOS transistor, each of the fourth and sixth NMOS transistors, and second supply PMOS transistor including a gate, a source, and a drain, wherein the drain of the fourth NMOS transistor is coupled to the source of the sixth transistor, and the drain of the second supply PMOS transistor is coupled to the drain of the sixth NMOS transistor, wherein the drain of the fourth NMOS transistor is coupled to the second data node.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
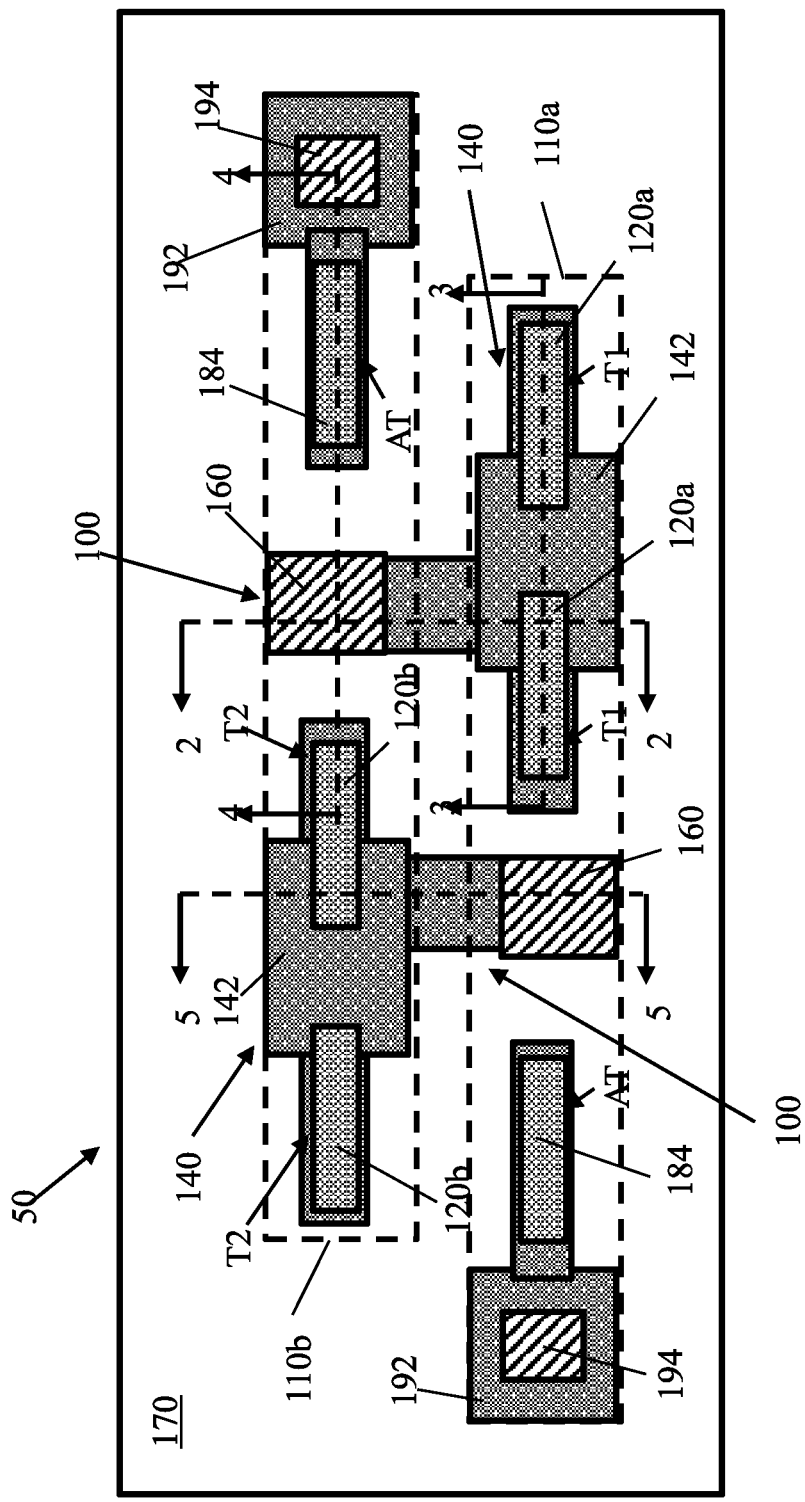
FIG. 1 shows a plan view of an SRAM cell with cross-couple structures according to embodiments of the disclosure

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

A transistor is a critical component for implementing digital and analog circuitry designs. Generally, a transistor, such as a MOSFET or metal oxide semiconductor field effect transistor, includes three electrical terminals: a source, a drain, and a gate. By applying different voltage levels to the gate terminal, the flow of electric current between the source terminal and the drain terminal of the transistor can be switched on or off. The presence or absence of an applied voltage at the gate terminal of a transistor can be identified as "on" and "off" states of the transistor. Thus, transistors can serve as a switching element in various circuit designs, e.g., by manipulating a voltage applied to the gate of each transistor and thereby affecting the flow of electrical current between source and drain terminals of each transistor. MOSFETs may be fabricated in two complementary varieties called p-type metal oxide semiconductor field effect transistors (PMOS) and n-type metal oxide semiconductor (NMOS). PMOS and NMOS differ in their configurations of materials found at their electrical terminals. When gated to a low input, a PMOS transistor will be "switched' on or enabled, but if the gated input is high, the PMOS transistor remains off. The opposite is true for NMOS transistors. If an NMOS transistor is gated to a high input, the transistor will be "switched" on or enabled, but if the gated input is low, the transistor will turn off. These attributes allow a transistor to be a fundamental component in electronic digital circuitry.

The following description describes various embodiments of an integrated level translator. Embodiments of the disclosure may allow for at least two different supply voltages, such as $V_{DD}$ and $V_{CS}$, to power a circuit without using conventional level shifters to reconcile the different voltages. Embodiments of the disclosure may be configured for use with single port SRAM and time domain multiplex SRAM cells, but it is understood that other embodiments may be configured for any circuit using different voltage supply sources. The integrated level translator is comprised of at least two cross-coupled PMOS transistors and complimentary bit-lines having a $V_{CS}$ voltage level coupled to a write bitswitch and write driver. The integrated level translator and its components include PMOS and NMOS transistors that act as logic switching gates that allow for areas of the circuit to be switched on or off depending on binary values, e.g., low or high, that are applied at the transistor gate. The embodiments described herein may the need for additional voltage level shift circuit structures, and thus may provide approximately a 14-16%, or greater percentage, improvement in memory density. Other benefits may include, e.g., faster cycle times for specific integrated chips, reduction in total write power, and/or reducing the total number of circuit components.

Referring to FIG. 1, an SRAM cell 50 including a pair of cross-couple structures 100 is shown. FIG. 1 provides a plan view of cross-couple structures 100. As shown, SRAM cell 50 may be composed of six transistors, each having different operational functions. A SRAM cell may generally include two pairs of cross-coupled transistors each structured to provide an inverter structure, with two access transistors alternatively enabling and disabling the electrical connection between each inverter (i.e., each cross-coupled pair of transistors) and a word line for controlling memory storage within the pairs of transistors.

SRAM cell 50 may include a pair of first transistors T1 adjacent to each other and connected to a single conductive region (e.g., gate metal 140 discussed herein) to yield one inverter structure for SRAM cell 50. SRAM cell 50 may also include a pair of second transistors T2 adjacent to each other and connected to a single, different conductive region (e.g., another gate metal 140) to provide a separate inverter structure. As shown specifically in FIG. 1, each pair of transistors T1, T2 may be associated with one of two access transistors AT for controlling the electrical connection between external conductive elements (e.g., a bit line) and the associated pairs of transistors T1, T2 in an SRAM. Access transistors AT themselves may be coupled at their gates to another conductive element, e.g., a word line, for controlling the electrical connection between each pair of transistors T1, T2 and a word line.

Figure 2:
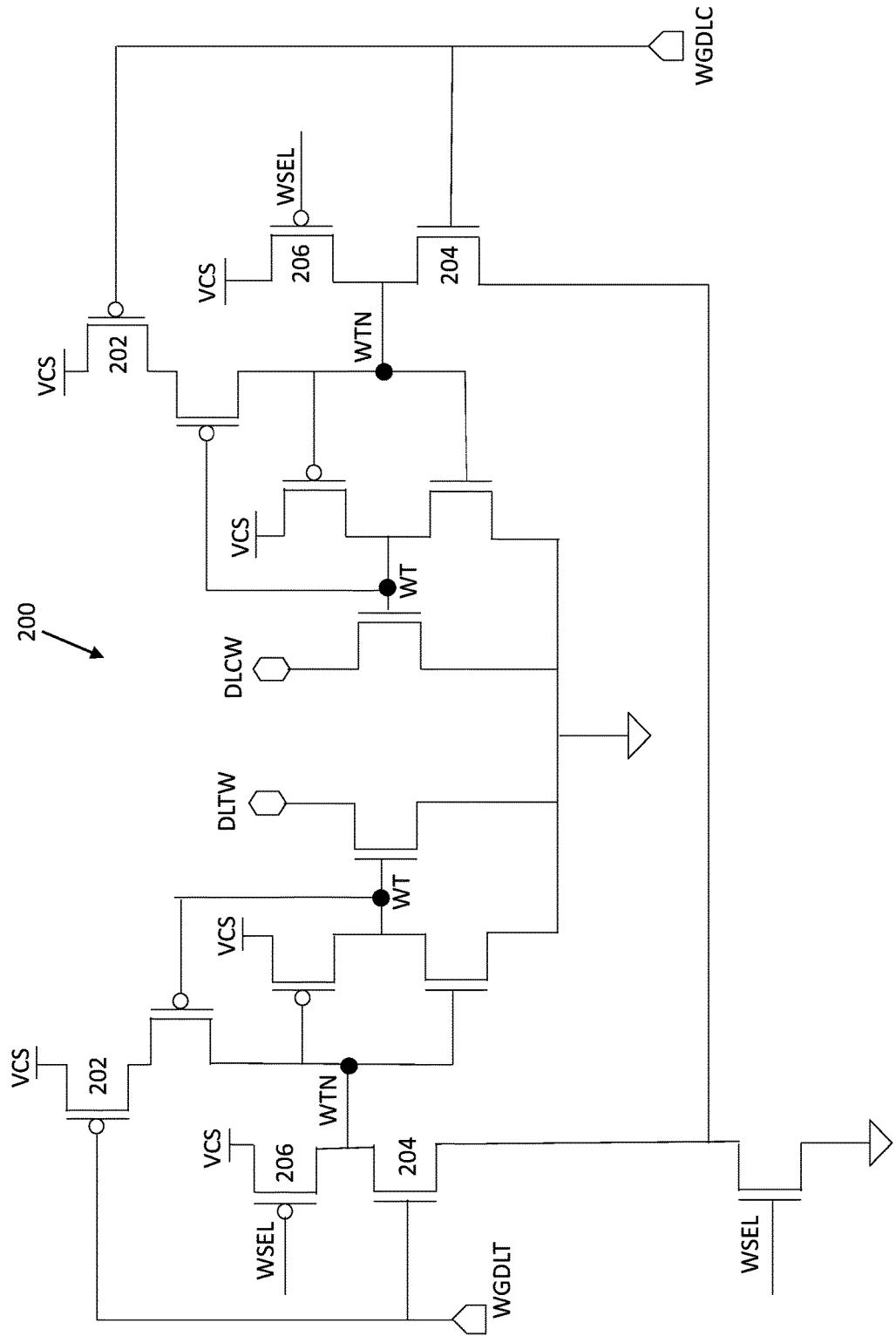
FIG. 2 shows a schematic view of a conventional write driver level translator structure for single port SRAM.

Turning to FIG. 2, a conventional write driver with a level translator circuit 200 is depicted as an example for the sake of comparison with embodiments of the present disclosure. Conventional write driver with a level translator circuit 200 is used to reconcile different voltage levels and voltage sources used in single port SRAM. Two important operations found in SRAM include read and write operations. Single port SRAM allows access to only one of these operations at a time, preventing multiple reads or writes to occur at the same time. Due to limitations in technology, write drivers currently require the use of higher voltages to accomplish write assist operations, usually denoted $V_{CS}$. This creates a conflict with other device circuitry that uses advancements in semiconductor technology to use a lower power supply, usually denoted $V_{DD}$. The use of both voltage levels $V_{CS}$ and $V_{DD}$ creates a conflict in the circuit that must be reconciled for the device to perform as intended.

A conventional write driver with a level translator circuit 200 may include two write data lines, WGDLT and WGDLC. Both WGDLT and WGDLC have a first voltage level $V_{DD}$ entering conventional write driver with a level translator circuit 200. Clock signal WSEL has a second voltage level $V_{CS}$. WSEL, like traditional clock signals, oscillates between 1/high and 0/low states, allowing areas of the circuit to be turned on or off at predetermined times. Although logic level high (i.e., "1" representing an active-high signal and "0" representing an active-low signal) is discussed as an example, the opposite may be true in a logical low configuration. WGDLT and WGDLC may have either a 1/high or 0/low value. WGDLT and WGDLC are essentially coupled to identical circuitry. WGDLT and WGDLC are gate coupled to PMOS transistor 202 and NMOS transistor 204. PMOS transistors are activated when a 0/low value is applied to its gate. NMOS transistors are activated when a 1/high value is applied to its gate. Since WGDLT and WGDLC are gate coupled to both PMOS transistor 202 and NMOS transistor 204, this allows the circuit to evaluate WGDLT and WGDLC whether the write data lines are 0/low or 1/high. Clock signal WSEL is gate coupled to PMOS transistor 206. PMOS transistors 202 and 204 are also source coupled to $V_{CS}$ voltage sources. When PMOS transistors 202 and 206 are activated by being gated to a 0/low value, either WSEL or WGDLT/WGDLC, allows the voltage source $V_{CS}$ to power the write driver. This method of reconciling the two voltages $V_{CS}$ and $V_{DD}$ requires the addition of many additional components, e.g., at least 15 additional transistors.

Figure 3:
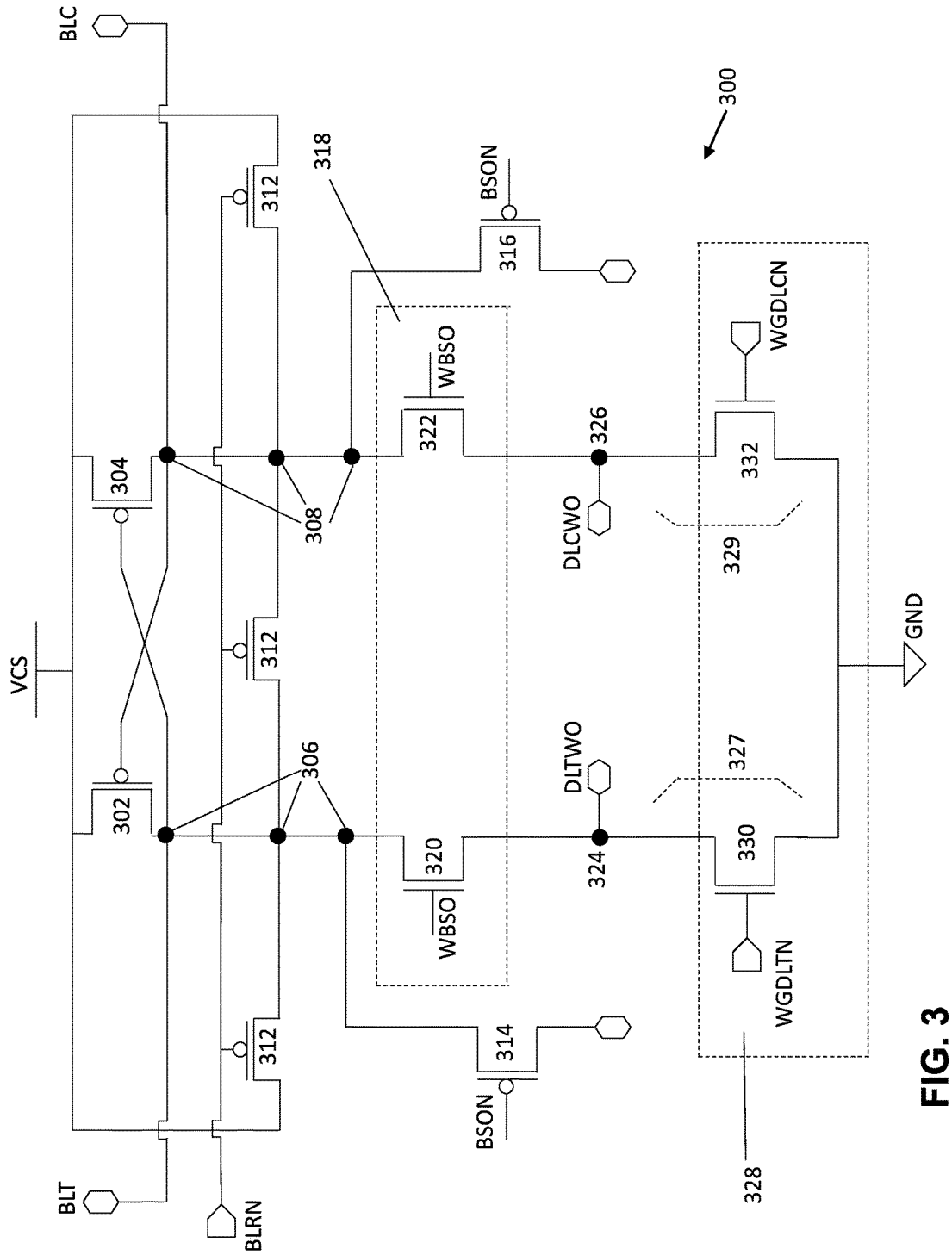
FIG. 3 shows a schematic view of an integrated level translator circuitry with a write driver and bitswitch according to the disclosure.

FIG. 3 depicts an embodiment of a write driver and bitswitch with a level translator circuit 300, simply 'circuit structure' hereinafter, according to embodiments of the disclosure. Circuit structure 300 may include a first PMOS transistor 302 and a second PMOS transistor 304. Each PMOS transistor may have a gate, a source and a drain. PMOS transistors 302 and 304 may be coupled to a first voltage source $V_{CS}$. $V_{CS}$ may have a higher voltage level than a voltage level used to power peripheral circuitry. The gate of first PMOS 302 may be cross coupled to drain of second PMOS transistor 304, and the gate of second PMOS 304 may be cross coupled to drain of first PMOS transistor 302. Drains of first and second PMOS transistors 302 and 304 may also be coupled to a first and second bit-line node 306, 308 respectively. Bit-line node 306 and 308 may also be coupled to at least three pre-charged PMOS transistors 312. Pre-charged PMOS transistors 312 may be gate coupled to first control signal BLRN. Depending on the value of first control signal BLRN, the pre-charged PMOS transistors may or may not be activated.

Bit-line node 306 may also be coupled to the source of first input PMOS transistor 314. First input PMOS transistor 314 may be gate coupled to a second control signal BSON in addition to a coupled to data line true, DLT. Bit-line node 308 may be coupled to a source of a second input PMOS transistor 316. The gate of second input PMOS transistor 316 may be coupled to second control signal BSON. The drain of second input PMOS transistor 316 may be connected to data line complimentary, or DLC. During operation, first and second input PMOS transistor 314, 316 may be used to provide additional circuit control and analysis.

Circuit structure 300 may also include write bit-switch 318. Write bit-switch 318 may have a first and second NMOS transistor 320, and 322, respectively. The drain of first NMOS transistor 320 may be coupled to first bit-line node 306. First NMOS transistor 320 may also be gated to bit-switch input WBS0. Bit-switch input WBS0 may have a $V_{CS}$ voltage source. As noted elsewhere herein, this $V_{CS}$ voltage source may have a higher level voltage than the voltage found in peripheral circuitry. The second NMOS transistor 322 is connected similarly to first NMOS transistor 320. The drain of second NMOS transistor 322 is coupled to bit-line node 308, and is connected at the gate to bit-switch input WBS0. The sources of both first and second NMOS transistors 320 and 322 are connected to a first and second data node 324, 326 respectively. A pair of data inputs, DLTW0 and DLCW0 are applied to the first and second data nodes 324, 326. Specifically, DLTW0 is input at first data node 324 and DLCW0 is input at second data node 326. DLTW0 may be a different input as DLCW0 or DLTW0 and DLCW0 may be the same input.

Circuit structure 300 may also include a write driver 328. Write driver 328 may include a first and second transistor stack, 327, 329 respectively. First and second transistor stack 327 and 329 may have any number of transistors or transistor type combinations, such as PMOS and NMOS transistors. First transistor stack 327 may be coupled between first data node 324 and a ground GND. Second transistor stack may be coupled between second dada node 326 and ground GND. For example, first transistor stack may include third NMOS transistor 330 and second transistor stack may include fourth NMOS transistor 332. Third NMOS transistor 330 may be coupled at the drain to first data node 324 and coupled at the source to ground GND. Fourth NMOS transistor 332 may be coupled at the drain to second data node 332 and source coupled to the ground GND. Third NMOS transistor 330 may be coupled at the gate to first data control signal WGDLTN and fourth NMOS transistor 332 may be coupled at the gate to second data control signal WGDLCN. First and second data control signals WGDLTN and WGDLCN have a $V_{DD}$ voltage level.

As noted elsewhere herein, single port SRAM can have either a read or write operation occurring at a time. After the end of read cycle, first control signal BLRN, of circuit structure 300, may have a low value signal. This results in the three pre-charged PMOS devices being enabled. Placing the three pre-charged PMOS devices into an enabled state may allow first supply voltage $V_{CS}$ to flow through the pre-charged PMOS transistors with a high value to first and second bit-line node 306 and 308. This high value results in first bit-line BLT and second bit-line BLC having a high value. At the same time, WGDLT and WGDLC have high values activating third and fourth NMOS transistors 330, 332. This operation may allow first and second bit-lines 330 and 332 to be pulled low by the ground GND. At this time, the value of BLT and BLC at the first and second bit-line nodes 306 and 308 is low. BLT and BLC bit-lines recover the original high value when the low value at first and second bit-line nodes 306 and 308 enables first and second PMOS transistor 302, 304. Enablement of these two PMOS transistors allows $V_{CS}$ from the first voltage supply to flow through first and second PMOS transistors and restore BLT and BLC bit-lines to high value.

Figure 4:
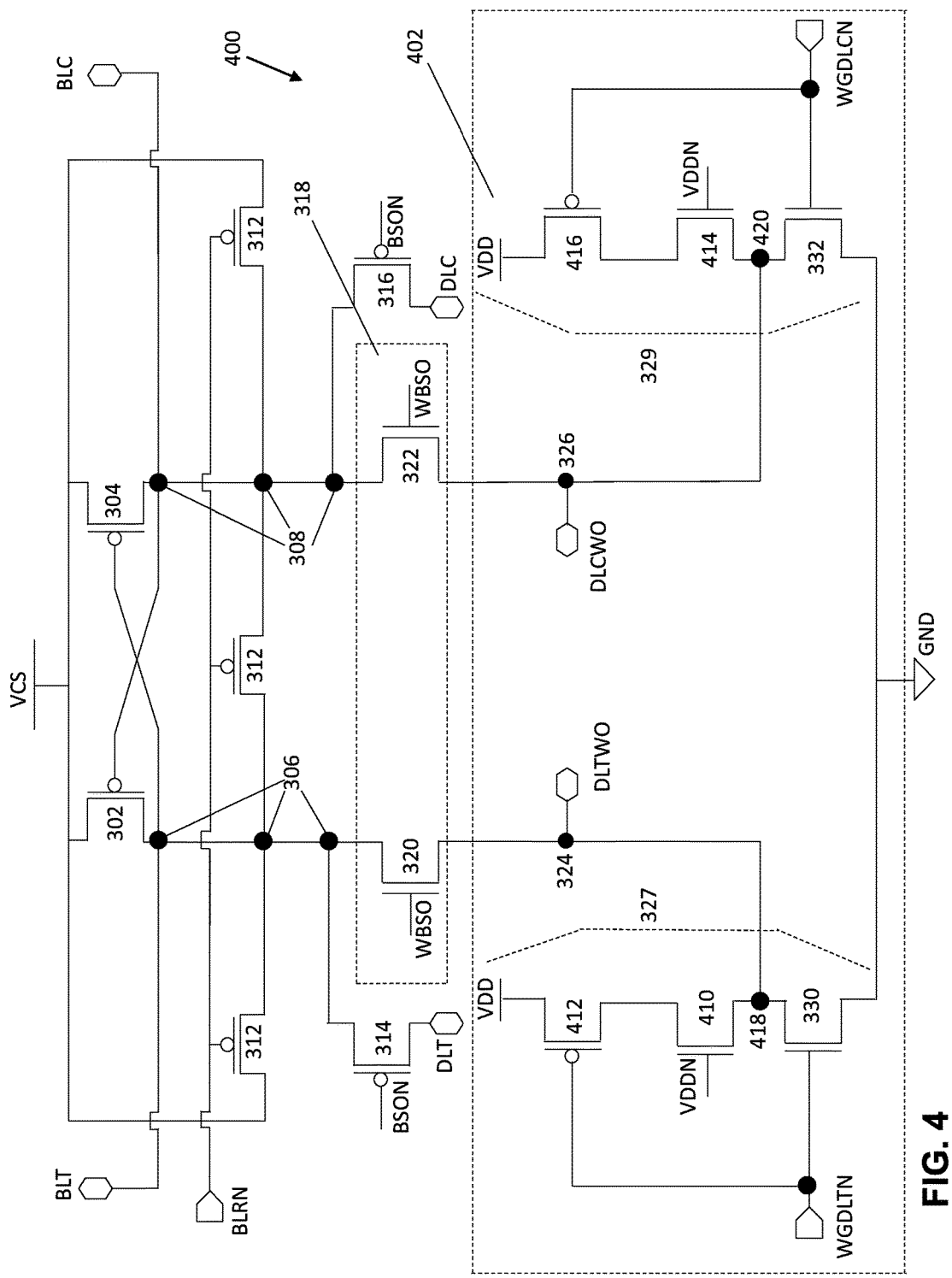
FIG. 4 shows a schematic view of an integrated level translator circuitry with a write driver and bitswitch according to the disclosure.

FIG. 4, depicts an embodiment of a write driver and bit-switch with a level translator circuit 400 that could be used in TDM SRAM, herein after simply referred to as "circuit structure." The circuit 400 is used in Time Division Multiplexed Memories (TDM) with Read followed by a Write (R+W) operation in a clock cycle or Write followed by a Write (W+W) operation in a clock cycle. Write driver and bit-switch with a level translator circuit 400 may include first PMOS transistor 302 and second PMOS transistor 304. First and second PMOS transistor 302, 304 may each be coupled at their source terminals to a first voltage source, $V_{CS}$ having a first voltage level. The gate of first PMOS transistor 302 can be cross coupled to the drain of second PMOS transistor 304. Similarly, the gate of second PMOS transistor 304 is cross-coupled to the drain of first PMOS transistor 302. The drains of first and second PMOS transistor may be coupled to first and second bit-line nodes 306, 308, respectively. First and second bit-lines BLT, BLC are coupled to bit-line nodes 306 and 308, respectively.

Circuit structure 400 may also include write bit-switch 318. Write bit-switch 318 may have a first and second NMOS transistor 320, and 322, respectively. The drain of first NMOS transistor 320 may be coupled to first bit-line node 306. First NMOS transistor 320 may also be gated to bit-switch input WBS0. Bit-switch input WBS0 may have a $V_{CS}$ voltage source. This $V_{CS}$ voltage source may have a higher level voltage than the voltage found in peripheral circuitry. The second NMOS transistor 322 is connected similarly to first NMOS transistor 320. The drain of second NMOS transistor 322 is coupled to bit-line node 308, and is connected at the gate to bit-switch input WBS0. The sources of both first and second NMOS transistors 320 and 322 are connected to a first and second data node 324, 326 respectively. A pair of data inputs, DLTW0 and DLCW0 are applied to the first and second data nodes 324, 326. Specifically, DLTW0 is input at first data node 324 and DLCW0 is input at second data node 326. DLTW0 may be a different input as DLCW0 or DLTW0 and DLCW0 may be the same input.

Circuit structure 400 may also include a write driver 402. Write driver may be made up of a first transistor stack 327 and a second transistor stack 329. First transistor stack 327 may have a third NMOS transistor 330, a fifth NMOS transistor 410, and a first supply PMOS 412. The drain of third NMOS transistor 330 is coupled to the source of fifth NMOS transistor 410. The drain of fifth NMOS transistor 410 may be coupled to the drain of first supply PMOS transistor 412. Write data control signal WGDLTN is gate coupled to first supply PMOS transistor 412 and to the gate of third NMOS transistor 330. First data node 324 is coupled to the connection between third NMOS transistor 330 and fifth NMOS transistor.

Write driver 402 may also include a second transistor stack, including a fourth NMOS transistor 332, a sixth NMOS transistor 414, and a second supply PMOS transistor 416. The drain of the fourth NMOS transistor 414 may be coupled to the source of the sixth transistor 414, and the drain of the second supply PMOS transistor 416 may be coupled to the drain of the sixth NMOS transistor 414. The drain of the fourth NMOS transistor 332 is coupled to second data node 326. The sources of third and fourth NMOS transistor 330, 332 may be source coupled at a ground GND. The first and second supply PMOS transistors 412, 416 may be coupled to a second voltage source $V_{DD}$. $V_{DD}$ has a different voltage level than the voltage level of $V_{CS}$. Fifth and sixth NMOS transistors 410, 414 are gated to an input VDDN that has a voltage level equal to second voltage source $V_{DD}$.

Write driver and bit-switch with a level translator circuit 400 may concurrently maintain read and write operations. In contrast to circuit structure 300 (FIG. 3), first and second bit-lines BLT, BLC of circuit structure 400 do not need to be precharged during the intra cycle for TDM memories. During writing operation, data control signal WGDLTN may have a low value. This low value applied to the gate of first supply PMOS transistor 412 to be enabled. Enabling the first supply PMOS transistor 412 may allow second voltage source $V_{DD}$ to flow through first supply PMOS transistor 412. As the $V_{DD}$ signal flows through fifth NMOS transistor 410 the voltage signal is no greater than $V_{DD}-V_t$. If the signal goes higher than $V_{DD}-V_t$, then fifth NMOS transistor 410 is turned off. Since data control signal WGDLTN is low, this prohibits the flow of signal to ground GND. During writing operation, WBS0 is also inputting a high signal value to first and second NMOS transistor 320, 322. This allows the $V_{DD}-V_t$ signal to flow through first NMOS transistor 320 and pulls the signal value of the first bit-line BLT to $V_{DD}-V_t$. The BLT at $V_{DD}-V_t$ will weaken the PMOS transistor 304. When data control signal WGDLTN is low, WGDLCN is high. As a result, the second bit-line BLC is enabled and is pulled to a low value through enabled fourth NMOS transistor 322 to ground GND. The BLC at GND will enable the PMOS transistor 302 and pull the first bitline BLT to $V_{CS}$. In cases when $V_{CS}<V_{DD}$, $V_{CS}-V_t$ is less than $V_{DD}-V_t$, first NMOS transistor 320 is turned off and there will be no current flow from $V_{CS}$ to $V_{DD}$. In cases when $V_{CS}>V_{DD}$, $V_{CS}-V_t$ is greater than $V_{DD}-V_t$, first NMOS transistor 410 is turned off and there will be no current flow from $V_{CS}$ to $V_{DD}$. In cases when $V_{CS}=V_{DD}$, $V_{CS}-V_t$ is equal to $V_{DD}-V_t$, this will result in no current flow from $V_{CS}$ to $V_{DD}$ as supplies are at same potential.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated level translator circuit structure comprising:
   a first PMOS transistor and second PMOS transistor each including a gate, a source and a drain;
   wherein the sources of the first and second PMOS transistor are coupled to a first voltage source, the gate of the first PMOS transistor is cross coupled to the drain of the second PMOS transistor, the gate of the second PMOS transistor is cross coupled to the drain of the first PMOS transistor, the drain of the first PMOS transistor is coupled to a first bit-line node, and wherein the drain of the second PMOS transistor is coupled to a second bit-line node;
   a write bit-switch having a first NMOS transistor coupled to the first bit-line node and a second NMOS transistor coupled to the second bit-line node, wherein the first and second NMOS transistors of the write bit-switch are respectively coupled to a pair of data nodes each receiving one of a pair of data inputs; and
   a write driver, having a pair of transistor stacks each coupled to between one of the pair of data nodes and a ground.

2. The circuit structure of claim 1, wherein one of the pair of transistor stacks includes third NMOS transistor, a fifth NMOS transistor, and a first supply PMOS transistor, each of the third and fifth NMOS transistors and first supply PMOS transistor including a gate, a source, and a drain, the drain of the third NMOS transistor is coupled to a driver node, and the driver node is coupled to the source of the fifth NMOS transistor, and wherein the drain of the first supply PMOS transistor is coupled to the drain of the fifth NMOS transistor.

3. The circuit structure of claim 2, wherein the first supply PMOS transistor and the third NMOS transistor of the pair of NMOS transistors of the first transistor stack are configured to receive a first input signal from one of the pair of data inputs.

4. The circuit structure of claim 1, wherein the first bit-line node and second bit-line node are configured to receive a first bit-line input and a second bit-line input, respectively.

5. The circuit structure of claim 1, further comprising a first input PMOS transistor, having a gate, a source, and a drain, wherein the source of the first input PMOS transistor is coupled to the first bit-line node.

6. The circuit structure of claim 5, wherein the gate of the first input PMOS transistor is configured to receive a first control signal.

7. An integrated level translator circuit structure comprising:
   a first PMOS transistor and a second PMOS transistor each including a gate, a source and a drain;
   wherein the sources of the first and second PMOS transistors are coupled to a first voltage source, the gate of the first PMOS transistor is cross coupled to the drain of the second PMOS transistor, the gate of the second PMOS transistor is cross coupled to the drain of the first PMOS transistor, the drain of the first PMOS transistor is coupled to a first bit-line node, and wherein the drain of the second PMOS transistor is coupled to a second bit-line node;
   a write bit-switch having a first NMOS transistor coupled to the first bit-line node and a second NMOS transistor coupled to the second bit-line node, wherein the first and second NMOS transistors of the write bit-switch are coupled to a first and second data node, respectively, and wherein the first and second data node are configured to receive a pair of data inputs; and
   a write driver having a third NMOS transistor and fourth NMOS transistor, each of the third and fourth NMOS transistors including a gate, a source and a drain, wherein the sources of the third and fourth NMOS transistors are coupled to a ground, wherein the drains of the third and fourth NMOS transistors are coupled to the first and second data nodes respectively.

8. The circuit structure of claim 7, wherein the first bit-line node and second bit-line node are configured to receive a first bit-line input and a second bit-line input, respectively.

9. The circuit structure of claim 7, further comprising a first input PMOS transistor coupled to the first bit-line node.

10. The circuit structure of claim 9, wherein the first input PMOS transistor includes a gate coupled to a second control signal.

11. The circuit structure of claim 7, wherein the gates of the third and fourth NMOS transistor are configured to receive input signals.

12. The circuit structure of claim 7, wherein the pair of data inputs comprises at least two distinct data inputs.

13. A write driver and bitswitch circuit structure with a level translator, the structure comprising:
    a first PMOS transistor and a second PMOS transistor each including a gate, a source and a drain;
    wherein the sources of the first and second PMOS transistor source are coupled to a first voltage source, the gate of the first PMOS transistor is cross coupled to the drain of the second PMOS transistor, the gate of the second PMOS transistor is cross coupled to the drain of the first PMOS transistor, the drain of the first PMOS transistor is coupled to a first bit-line node, and wherein the drain of the second PMOS transistor is coupled to a second bit-line node;
    a write bit-switch having a first NMOS transistor coupled to the first bit-line node and a second NMOS transistor coupled to the second bit-line node, wherein the first and second NMOS transistors of the write bit-switch are coupled to a first and second data node, respectively, and wherein the first and second data node are configured to receive a pair of data inputs; and
    a write driver, further including:
      a first transistor stack, having a third NMOS transistor, a fifth NMOS transistor, a first supply PMOS transistor, each of the third and fifth NMOS transistors and first supply PMOS transistor including a gate, a source, and a drain, wherein the drain of the third NMOS transistor is coupled to the source of the fifth NMOS transistor, and the drain of the first supply PMOS transistor is coupled to the drain of the fifth NMOS transistor, wherein the drain of the third NMOS transistor is coupled to the first data node; and
      a second transistor stack, having a fourth NMOS transistor, a sixth NMOS transistor, a second supply PMOS transistor, each of the fourth and sixth NMOS transistors, and second supply PMOS transistor including a gate, a source, and a drain, wherein the drain of the fourth NMOS transistor is coupled to the source of the sixth transistor, and the drain of the second supply PMOS transistor is coupled to the drain of the sixth NMOS transistor, wherein the drain of the fourth NMOS transistor is coupled to the second data node.

14. The circuit structure of claim 13, wherein the first bit-line node and second bit-line node are configured to receive a first bit-line input and a second bit-line input, respectively.

15. The circuit structure of claim 14, further comprising a first input PMOS transistor having a gate, a source, and a drain, wherein the source of the first input PMOS transistor is coupled to the first bit-line node.

16. The circuit structure of claim 15, wherein the gate of the first input PMOS transistor is configured to receive a first control signal.

17. The circuit structure of claim 16, wherein the source from the third NMOS transistor and the source of the fourth NMOS transistor are coupled to a ground.

18. The circuit structure of claim 16, wherein the drain of the first supply PMOS transistor is coupled to a second voltage source.

19. The circuit structure of claim 18, wherein the first voltage source has a first voltage level and the second voltage source has a second voltage level, and wherein the first and second voltage levels are different.

20. The circuit structure of claim 13, wherein the fifth NMOS transistor is gated to a third voltage source.

* * * * *